(12) United States Patent
Yamashita et al.

(10) Patent No.: US 6,869,262 B2
(45) Date of Patent: Mar. 22, 2005

(54) VACUUM APPARATUS AND TRANSFER APPARATUS

(75) Inventors: Yoshihiro Yamashita, Chiba (JP); Yoshihiro Enomoto, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 10/090,077

(22) Filed: Mar. 1, 2002

(65) Prior Publication Data

US 2002/0146304 A1 Oct. 10, 2002

(30) Foreign Application Priority Data

Mar. 2, 2001 (JP) ........................................ 2001-058981

(51) Int. Cl.[7] .............................................. B65G 49/07
(52) U.S. Cl. ..................... 414/217; 414/749.1; 414/935
(58) Field of Search ............................. 414/217, 217.1, 414/221, 749.1, 935, 939, 218; 901/19, 21, 36; 198/468.2, 468.8, 468.9, 621.1, 750.2, 750.11, 346.2

(56) References Cited

U.S. PATENT DOCUMENTS

| | | | | |
|---|---|---|---|---|
| 3,968,885 A | * | 7/1976 | Hassan et al. .............. 414/591 |
| 4,055,259 A | * | 10/1977 | Sibrava ....................... 414/152 |
| 4,483,651 A | * | 11/1984 | Nakane et al. .............. 414/217 |
| 4,604,020 A | | 8/1986 | Toro Lira et al. ........... 414/217 |
| 4,609,320 A | * | 9/1986 | Rubin ......................... 198/842 |
| 4,699,555 A | * | 10/1987 | Guarino ...................... 414/217 |
| 4,735,548 A | * | 4/1988 | Kimata et al. ........... 414/744.3 |
| 5,236,295 A | | 8/1993 | Ishii et al. .................. 414/222 |
| 5,551,821 A | * | 9/1996 | Hall ............................. 414/18 |
| 5,564,889 A | * | 10/1996 | Araki ......................... 414/806 |
| 5,611,248 A | * | 3/1997 | Peltier ..................... 74/490.09 |

FOREIGN PATENT DOCUMENTS

EP     0525633     2/1993

* cited by examiner

Primary Examiner—Dean J. Kramer
(74) Attorney, Agent, or Firm—Adams & Wilks

(57) ABSTRACT

A vacuum apparatus has a process chamber for processing a workpiece and a transfer apparatus for positioning the workpiece in the process chamber and for removing the workpiece from the process chamber. The transfer apparatus has a pair of generally parallel and spaced-apart transfer bodies and a workpiece holder connected to the transfer bodies for supporting the workpiece. A feeding mechanism feeds the transfer bodies in a longitudinal direction thereof to position the workpiece holder and the workpiece in the process chamber.

23 Claims, 4 Drawing Sheets

VACUUM APPARATUS AND TRANSFER APPARATUS

BACKGROUND OF THE INVENTION

1. Field of the Invention

The present invention relates to a vacuum apparatus and a transfer apparatus for use with a semiconductor manufacturing apparatus, a manufacturing apparatus for a flat panel display, or the like.

2. Prior Art

In a manufacturing process of a semiconductor or a flat panel display, a work-piece such as a silicon wafer is subject to various kinds of processes such as etching, CVD, ashing, RTP, and dry cleaning. These processes need to be conducted in a clean and high vacuum, and, in order to obtain this vacuum environment, a large-scale apparatus is used when the work-piece is transferred to and transferred from the vacuum apparatus.

As a conventional apparatus of this kind, there is one provided with a load chamber for transfer to the vacuum chamber the work-piece from the outside under the atmospheric pressure and an unload chamber for transfer from the vacuum chamber the work-piece having finished processes to the outside. FIG. 9 shows an example of this vacuum apparatus.

In FIG. 9, a load chamber 701 and an unload chamber 702 are each arranged in contact with wall surfaces of a transfer chamber 703, which is located in the center of the apparatus. The transfer chamber 703 is, as shown in the figure, formed into a flat surface of a polygon shape, and is provided with a vacuum robot 704 in its center. Process chambers 705, 706 are arranged on the other wall surfaces. The process chambers 705, 706 are chambers for processing the work-piece, such as by a CVD process.

There are provided gate valves 707, 7-8, 709, 710 each having an airtight property in the walls which divide the load chamber 701, the unload chamber 702, and the process chambers 705, 706 from the transfer chamber 703. When the vacuum robot 704 transfers the work-piece, the gate valve 707, 708, 709, or 710 is opened. When the vacuum robot 704 finishes the transfer of the work-piece, the gate valve is closed to maintain an airtight environment. There is also provided doors 711, 712 each having an airtight property between the load chamber 701 and the unload chamber 702, respectively, and the outside. When a not-shown external robot or the like transfers the work-piece, the door 711 or 712 is opened. When the external robot finishes the transfer of the work-piece, the door is closed, exhaust is performed and pressure is reduced to a vacuum, thereby keeping airtightness with the atmosphere.

In the vacuum apparatus shown in FIG. 9, when the work-piece is transferred to the inside of the load chamber 701 by the external robot or the like and the door 711 is closed, pressure inside the load chamber 701 is reduced to a vacuum, and thereafter the gate valve 707 to the transfer chamber 703 is opened. Then, the vacuum robot 704 inside the transfer chamber operates, and a first holder hand thereof (not shown) makes the work-piece inside the load chamber 701 be accommodated in the inside of the transfer chamber 703. Next, the gate valve 707 between the load chamber 701 and the transfer chamber 703 is closed, and the gate valve 709 between the process chamber 705 of a first process and the transfer chamber 703 is opened. At the same time, the vacuum robot 704 turns holding the work-piece, faces this gate valve 709 and stops its motion. Subsequently, the vacuum robot 704 accommodates the work-piece inside the process chamber 705 having finished the first process with a second holder hand thereof (not shown), and transfers to the inside of the process chamber 705 the work-piece before going through the first process, which is held by the first holder hand. Then, the gate valve 709 is closed, and the work-piece is subject to processing of the first process inside the closed process chamber 705.

With a similar operation to the above, the work-piece subsequently finishes processing of a second process (another process chamber 706), and in a state that the vacuum robot 704 holds the work-piece having finished the processing, the vacuum robot 704 faces the unload chamber 702. When it is confirmed that the unload chamber 702 is in a vacuum state, the gate valve 708 between the transfer chamber 703 and the unload chamber 702 is opened, and the work-piece is transferred to the unload chamber 702. Then, the gate valve 708 is closed and the door 712 is opened by making the inside of the unload chamber 702 be in the atmospheric pressure, and the work-piece having finished the processing is taken out to the outside by the external robot or the like.

The vacuum apparatus shown in FIG. 9 is suitable for mass production as described above. However, the operation of transferring the work-piece to and from the process chamber is complicated, and the apparatus is of large-scale, the cost of which is higher and requires a large space.

In addition, as a conventional apparatus of this kind, as shown in FIG. 10, there is known one provided with a load/unload chamber 801 for loading the work-piece from the outside under the atmospheric pressure and unloading the work-piece having been subject to the processing to the outside, which is interposed between the outside and a transfer chamber 802.

In the vacuum apparatus shown in FIG. 10, when the work-piece is transferred to the inside of the load/unload chamber 801 by an external robot or the like and a door 803 is closed, pressure inside the load/unload chamber 801 is reduced to a vacuum, and thereafter a gate valve 804 to the transfer chamber 802 is opened. Then, a vacuum robot 805 inside the transfer chamber operates, and a first holder hand thereof (not shown) makes the work-piece inside the load/unload chamber 801 be accommodated in the inside of the transfer chamber 802. Next, the gate valve 804 between the load/unload chamber 801 and the transfer chamber 802 is closed, and a gate valve 807 between a process chamber 806 and the transfer chamber 802 is opened. At the same time, the vacuum robot 805 turns holding the work-piece, faces this gate valve 807 and stops its motion. Subsequently, the vacuum robot 805 accommodates the work-piece inside the process chamber 806 having finished processing with a second holder hand thereof (not shown), and transfers to the inside of the process chamber 806 the work-piece before going through the processing, which is held. Then, the gate valve 807 is closed, and the work-piece is subject to the processing inside the closed process chamber 806.

While this processing is performed, a new work-piece is set in the load/unload chamber 801, and pressure in the load/unload chamber 801 is reduced to a vacuum. The gate valve 804 is opened, and the work-piece having finished the processing, which is held by the second holder hand of the vacuum robot 805, is transferred to the load/unload chamber 801. The first holder hand makes the new work-piece be accommodated in the transfer chamber 802, and the gate valve 804 is closed.

Subsequently, the load/unload chamber 801 is made to be in the atmospheric pressure, and the door 803 between the outside and the load/unload chamber 801 is opened. Then, the external robot or the like takes out to the outside the work-piece having finished the processing.

The vacuum apparatus shown in FIG. 10 for performing loading and unloading in one chamber is simpler, is obtained at lower cost and is more space-saving as compared with the vacuum apparatus shown in FIG. 9. However, this vacuum apparatus has the transfer chamber and the load/unload chamber, and the vacuum robot in the transfer chamber requires a turning mechanism. Therefore, a large space is still required.

Further, as a transfer apparatus for a vacuum apparatus, for example, as disclosed in Japanese Patent Application Laid-open No. Hei 5-26318, there is known a frog-leg type transfer apparatus, in which two arms connected in series in its joint are made to be a pair, a transferred body support portion is attached to the tip end of the one of the arms and the rear end of the other arm is attached to a base, to thereby move the transferred body support portion by bending the arm. This frog-leg type transfer apparatus does not have a turning mechanism differing from the vacuum robot. However, since the arm is bent in its shrunk state, space for portions overhanging in its left and right is required.

The present invention is made in view of solving the above-mentioned problem, and an object of the present invention is to provide a vacuum apparatus used for a semiconductor manufacturing process and the like, which is space-saving and provided at low cost, and a transfer apparatus, which is suitable for use in this vacuum apparatus or in other narrow space and is space-saving.

SUMMARY OF THE INVENTION

In order to achieve the above-mentioned object, the vacuum apparatus of the present invention comprises: a process chamber for performing for a work-piece processing; and a transfer chamber connected to the process chamber via a gate valve for accommodating a transfer apparatus to an inside thereof, in which the transfer apparatus comprises: a tape provided with a work-piece holder hand in its tip end portion, in which the tip end portion extends to an inside of the process chamber in an extended state extending in a longitudinal direction, and is accommodated inside the transfer apparatus in a shrunk state; and feeding means for feeding this tape in the longitudinal direction.

In the vacuum apparatus or the transfer apparatus, if the transfer tape is a tape made of an elastic material having a curved cross section, certain rigidity is given to a thickness direction of the tape. If the thickness direction of the transfer tape is made to be perpendicular, the rigidity for receiving load increases and the tape becomes hard to be bent.

If the feeding means is a driving pulley, it becomes easy to control a feeding speed.

If a rear end side of the transfer tape is wound by means of winding means, a place for accommodating the transfer tape becomes compact.

If the tape is symmetrically provided as a pair and both tip end portions of this pair of transfer tapes are provided with one work-piece holder hand, the transfer and supporting of the work-piece holder hand becomes further stable.

If a tape accommodating cylinder is provided downward the transfer chamber and the rear end side of the transfer tape is accommodated inside this case, it becomes possible to make the area of the transfer chamber smaller.

When using the tape accommodating cylinder, magnets are provided in the inside and the outside of this tape accommodating cylinder. By making the magnet of the inside follow movement of the magnet of the outside, it becomes possible to move the tape from the outside of the vacuum apparatus.

Also, further, if the work-piece holder hand is attached to a tip member of a linear guide portion attached to a base of the transfer apparatus, supporting of the work-piece holder hand becomes further stable.

If this linear guide portion has a plurality of slide portions between the base and the tip member, it becomes possible to make a moving distance of the work-piece holder hand longer.

If a plurality of the holder hands for the work-piece are provided in the transfer apparatus and this plurality of holder hands for the work-piece are disposed in an upper side and a lower side, it becomes possible to perform transfer to and transfer from of the work-piece with one opening/closing operation of the gate valve.

DETAILED DESCRIPTION OF THE PREFERRED EMBODIMENTS

Hereinafter, embodiments according to the present invention will be described with reference to FIGS. 1–8.

First Embodiment

Figure 1:
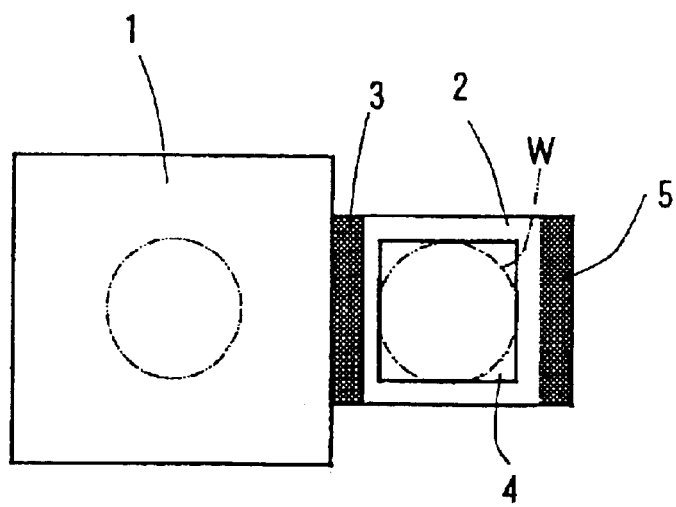
FIG. 1 is a diagram for explaining a construction of a vacuum apparatus according to the present invention.

FIG. 1 is a diagram for explaining a construction of a vacuum apparatus in accordance with the First embodiment of the present invention. Reference numeral 1 indicates a process chamber for processing a work-piece (a wafer in this embodiment) W such as by CVD. Reference numeral 2 indicates a transfer chamber connected to the process chamber 1 via a gate valve 3. A transfer apparatus 4 is set in this transfer chamber 2. Also, a blocking door 5 for loading/unloading the work-piece is provided between the transfer chamber 2 and the outside.

The transfer apparatus 4 is an apparatus for transferring the the work-piece W to the process chamber 1 from the outside via the transfer chamber 2 and transferring the work-piece W back to the transfer chamber 2 after processing of the work-piece is completed. The transfer apparatus 4 is constructed such that: when the gate valve 3 is opened, its tape is pulled out successively and made to be in an extended state to thereby perform transfer to and transfer from of the work-piece; and when the gate valve 3 is closed, the tape is made to be in a shrunk state to thereby be accommodated inside the transfer chamber 2.

The blocking door 5 opens when the work-piece W is loaded from the outside and the work-piece W is unloaded to the outside. In other instances, the blocking door 5 is closed to block the transfer chamber 2 from the air.

Figure 2:
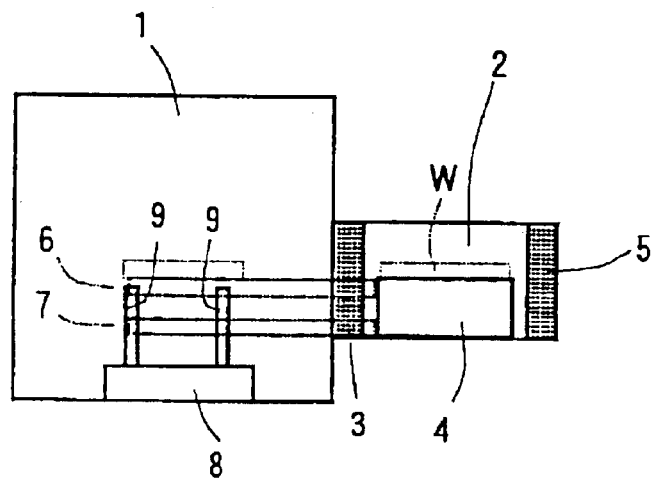
FIG. 2 is a cross-sectional diagram for showing a transfer chamber of FIG. 1.

FIG. 2 is a diagram for explaining a side surface of FIG. 1. As shown in FIG. 2, on upper and lower sides of the transfer apparatus 4, there are provided holder hand transfer bodies 6, 7 composed of a pair of tapes. These holder hand transfer bodies 6, 7 are provided with a work-piece holder hand in their tip end portions and, as described later in detail, are constructed so as to move the work-piece holder hand in left and right directions in the figure.

Note that, reference numeral 8 in FIG. 2 indicates a susceptor for disposing the work-piece W to perform the processing, and reference numeral 9 indicates lift pins for delivering the work-piece W between the work-piece holder hand of the transfer apparatus 4 and the susceptor 8.

Explanation will be made of a transfer mechanism of the transfer apparatus 4 below. However, in order to avoid complication of the explanation, only the holder hand transfer body 6 will be described with reference to FIG. 3 to FIG. 7.

Figure 3:
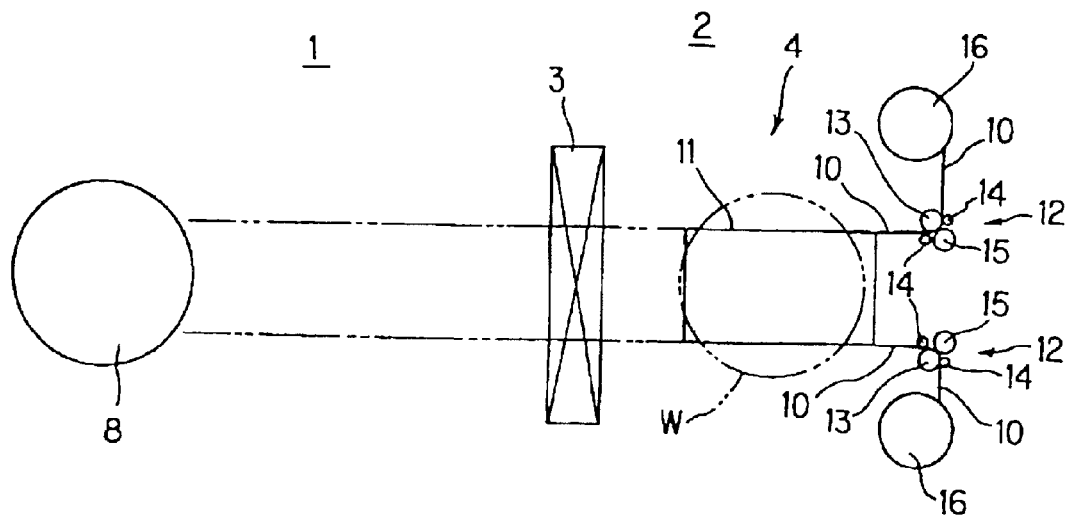
FIG. 3 is a plan view for schematically showing an embodiment of a transfer apparatus set inside the transfer chamber of FIG. 2.
Figure 4:
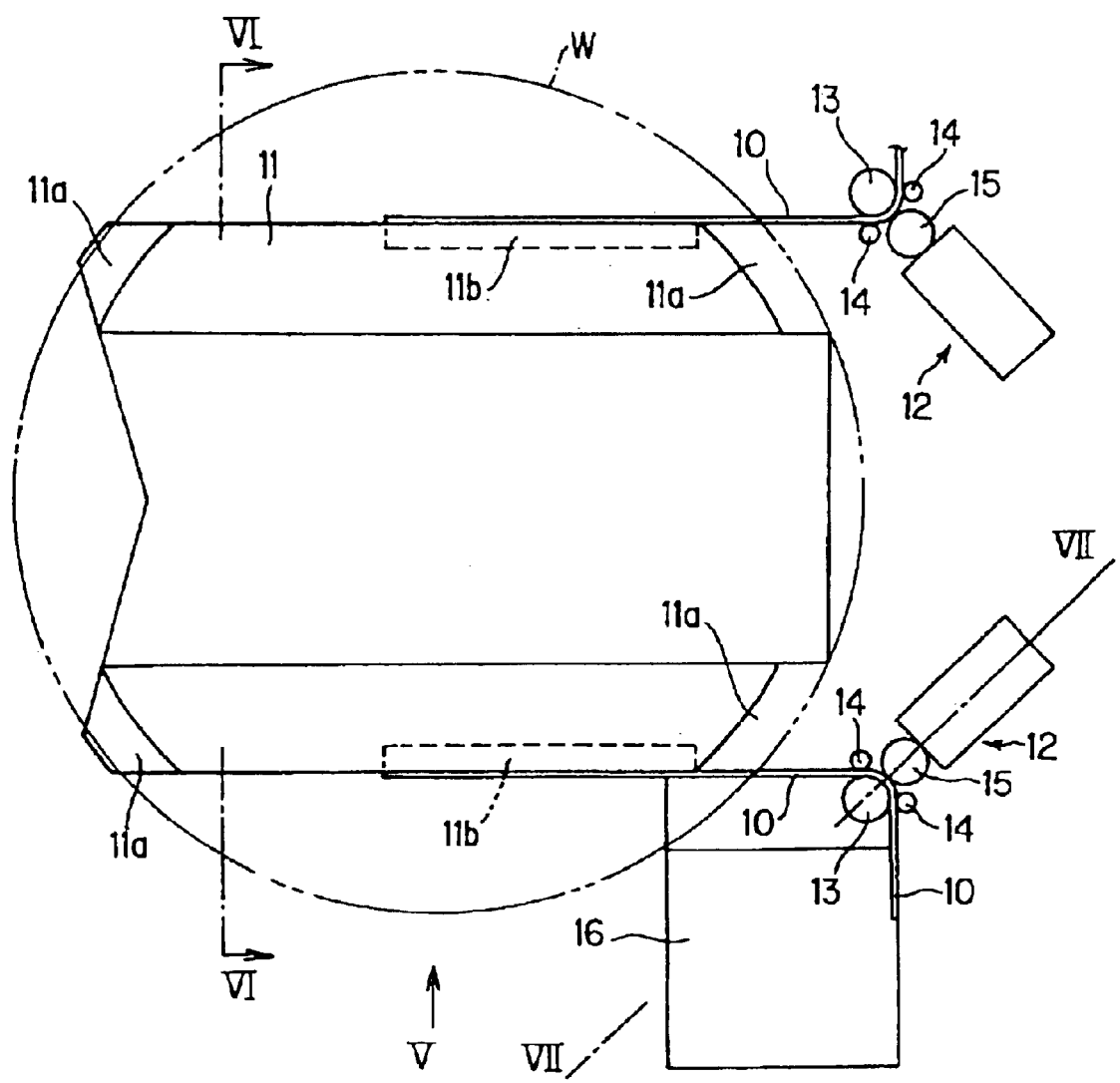
FIG. 4 is a plan view for showing the transfer apparatus in a state in which a tape and a holder hand in FIG. 3 are returned.
Figure 5:
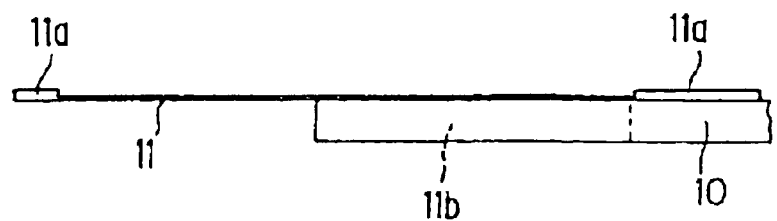
FIG. 5 is a view seen from an arrow V of FIG. 4.
Figure 6:
FIG. 6 is a view seen from an arrow VI of FIG. 4.
Figure 7:
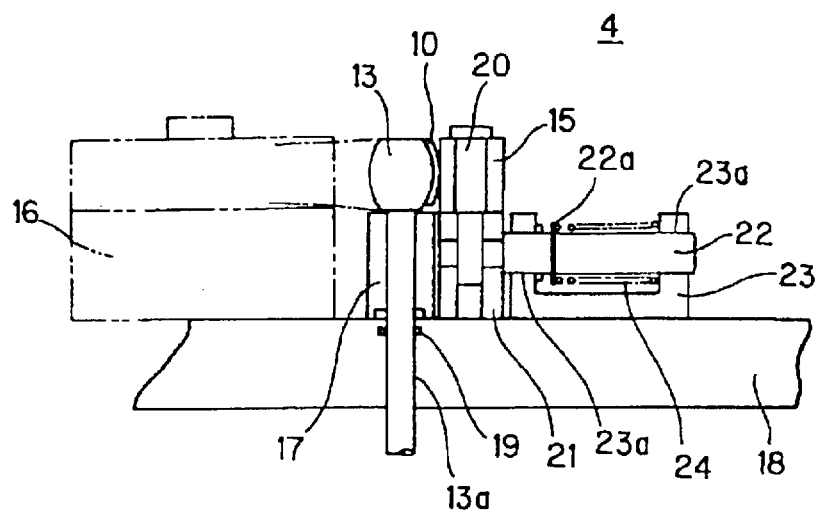
FIG. 7 is a cross-sectional diagram cut along a line VII—VII of FIG. 4.

FIG. 3 is a plan view for schematically showing the holder hand transfer body 6 of the transfer apparatus 4 disposed inside the vacuum apparatus, FIG. 4 is a plan view for showing the transfer apparatus in a state which makes a tape in FIG. 3 be in a shrunk state and returns the work-piece holder hand, FIG. 5 and FIG. 6 are a view seen from an arrow V and a view seen from an arrow VI of FIG. 4, respectively, and FIG. 7 is a cross-sectional side view for showing feeding means of a tape in FIG. 4.

In FIG. 3–FIG. 7, the holder hand transfer body 6 is composed of a pair of tapes 10, 10 disposed parallelly, and a work-piece holder hand 11 is attached to the tip end portions of these tapes 10, 10. Also, on the rear end sides of the tapes 10, 10, a pair of feeding means 12, 12 for feeding the tapes in a longitudinal direction is provided. This pair of feeding means 12, 12 operates in synchronism with each other.

The cross-sectional shape of the tape 10 is made to be a curved cross section in this embodiment, a used material of which is a nickel-base spring member made of metal, which is high in durability and is resistant to rust. The curved cross section increases rigidity of the tape, and, as in this embodiment, when a width direction of the tape matches upper and lower directions in its use, the work-piece holder hand 11 and the work-piece W disposed thereon are sufficiently supported. The thickness of the tape 10 and the degree of the curvature can be selected according to the weight of the work-piece to be holder handled. Note that, provided that the material has sufficient rigidity and elasticity, the curved cross sectional shape is not necessarily essential, and even a non-metallic material can be used.

In this embodiment, the work-piece is a semiconductor wafer held by the work-piece holder hand 11. Thus, support portions 11a, 11a, . . . for supporting four points in an outer periphery of the wafer W are protruded upward and attaching portions 11b, 11b to the tape 10 are protruded downward.

The feeding means 12 is a driving pulley 13 for winding and hanging the tape 10 to drive the tape 10 in its longitudinal direction in this embodiment. In order to increase frictional contact of the driving pulley 13 and the tape 10, a pressing/direction-converting pulley 15 presses the tape 10 from its back surface to the driving pulley 13 side. Reference numerals 14, 14 indicate guide pulleys for guiding the tape 10 in the front and the rear of a direction-converting portion of the tape 10.

The rear end side of the tape 10 is bent by 90° along the driving pulley 13 by the pressing/direction-converting pulley 15, and is wound by winding means 16 of a reel structure. This winding means 16 is constructed such that the end of the tape 10 is fixed to a winding core inside its case and the tape 10 is wound due to a spring action.

As shown in FIG. 7, a shaft 13a of the driving pulley 13 is protruded to the outside of the transfer chamber 2, which is the lower side of the transfer apparatus 4, and is subject to normal and reverse rotation drive by a not-shown motor. Reference numeral 17 indicates a bearing which is projectingly provided from a bottom surface 18 of the transfer apparatus to the inside, and this bearing 17 holds the shaft 13a of the driving pulley in a rotatable manner. Further, a seal 19 in the form of an O-ring is provided in the shaft 13a inside the bottom surface 18, and the seal 19 keeps airtightness in the transfer chamber 2. Note that a magnetic fluid seal may be used instead of an O-ring. Further, a vacuum motor or an ultrasonic motor, which can be used in a vacuum, is used as a driving source of the pulley 13 and this is set inside the transfer chamber 2, thereby making it possible to eliminate the seal.

A pulley surface of the driving pulley 13 is formed into a drum shape corresponding to the curved cross section of the tape 10. Each pulley surface of the guide pulley 14 and the pressing/direction-converting pulley 15 is formed into a straight cylindrical shape. Note that, in order to prevent dust from generating, it is preferable that the pulley surface of the driving pulley 13 is formed into a drum shape having a smaller radius of curvature than that of the curved cross sectional shape of the tape 10, and each pulley surface of the guide pulley 14 and the pressing/direction-converting pulley 15 is formed into slightly a drum shape to reduce a contact area with the tape 10, to thereby eliminate friction accompanied with deformation of the curved cross sectional shape in bending the tape 10.

The pressing/direction-converting pulley 15 is mainly supported by a support shaft 20 and thus can freely rotate. The support shaft 20 is fixed to a support shaft seat 21. A pin 22 is protruded from the side of this support shaft seat 21, this pin 22 thrusts a guide hole 23a of a pressing means base 23, and a spring 24 elastically provided between the pressing means base 23 and the pin 22 pushes the pin 22 to the driving pulley 13 side, such that the pressing/direction-converting pulley 15 presses and sandwiches the tape 10 between the driving pulley 13. Note that, reference symbol 22a indicates an E ring which is fit into an outer peripheral groove of the pin 22, and the spring 24 is, more specifically, elastically provided between this E ring and the pin 22.

The guide pulley 14 is disposed at the front and the rear of the pressing/direction-converting pulley 15, with a space equal to the thickness of the tape 10 provided, and is rotatable similarly to the pressing/direction-converting pulley 15.

The above description is made for the holder hand transfer body 6 of an upper stage. However, the holder hand transfer body 7 of a lower stage is also constructed in the same manner.

Next, an explanation is provided for the operation of the first embodiment of the vacuum apparatus.

When the gate valve 3 closes, the tapes 10, 10 of both the upper stage and the lower stage are accommodated inside the transfer chamber together with the work-piece holder hand 11 and are in a shrunk state as shown in FIG. 4. At this time, the rear end sides of the tapes 10, 10 are wound to the inside of the winding means 16, 16.

When the gate valve 3 opens and the work-piece holder hand 11 in the lower side receives and transfers the work-piece W having finished the processing on the susceptor 8, or the work-piece W held on the work-piece holder hand 11 is transferred to the process chamber 1 to be set on the susceptor 8, drive of the pair of driving pulleys 13 at the upper stage or the lower stage makes the tape 10 be pulled out successively to the inside of the process chamber 1 in the longitudinal direction, as shown in a double-dotted chain line of FIG. 2 or FIG. 3. Then, the tape 10 is in an extended state and the work-piece holder hand 11 reaches the upper side of the susceptor 8, to thereby receive or deliver the work-piece W from the susceptor 8.

Note that, as regards delivering the work-piece W to and from the susceptor 8, the work-piece W is smoothly delivered while the lift pins 9, 9 go up and down by a not-shown elevating mechanism in cooperation with coming in and out of the object in the left and right of the work-piece holder hand 11.

When returning the work-piece holder hand 11, the driving pulley 13 rotates in a reverse direction. This rotation in the reverse direction pulls back the tapes 10, 10 successively. Then the work-piece holder hand 11 is pulled back to the inside of the transfer chamber 2, and the rear end portion sides of the tapes 10, 10 are wound to the inside of the winding means 16.

In such pulley drive, it is possible to drive a tape in a speed corresponding to an environment of use, whereby the work-piece can be smoothly and safely transferred without generating dust.

Since the holder hand transfer bodies 6, 7 of the transfer apparatus 4 linearly extend and shrink in a one-dimensional direction without turning, moving in left and right or widening laterally, the transfer chamber 2 can be compactly constructed. Further, since the holder hand transfer bodies 6, 7 do not go up and down, the height of the transfer chamber 2 can be lowered and a volume in the transfer chamber can be extremely reduced. If the volume in the transfer chamber is small, it shortens exhaust time upon making the transfer chamber 2 be in a vacuum and vent time upon making the transfer chamber 2 return to the air.

Second Embodiment

Figure 8:
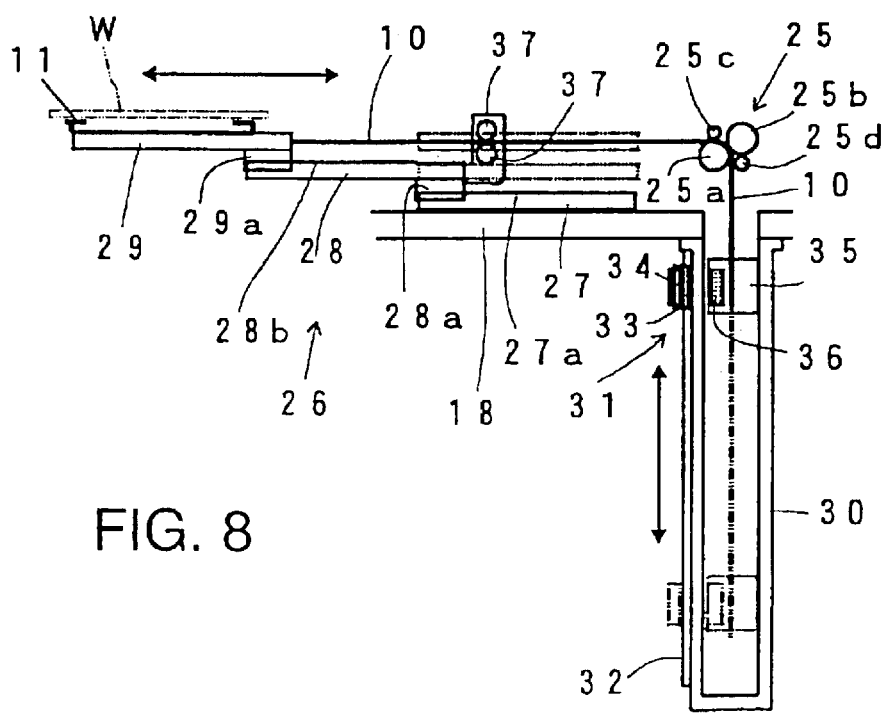
FIG. 8 is a cross-sectional side view for showing another embodiment of a transfer apparatus according to the present invention.
Figure 9:
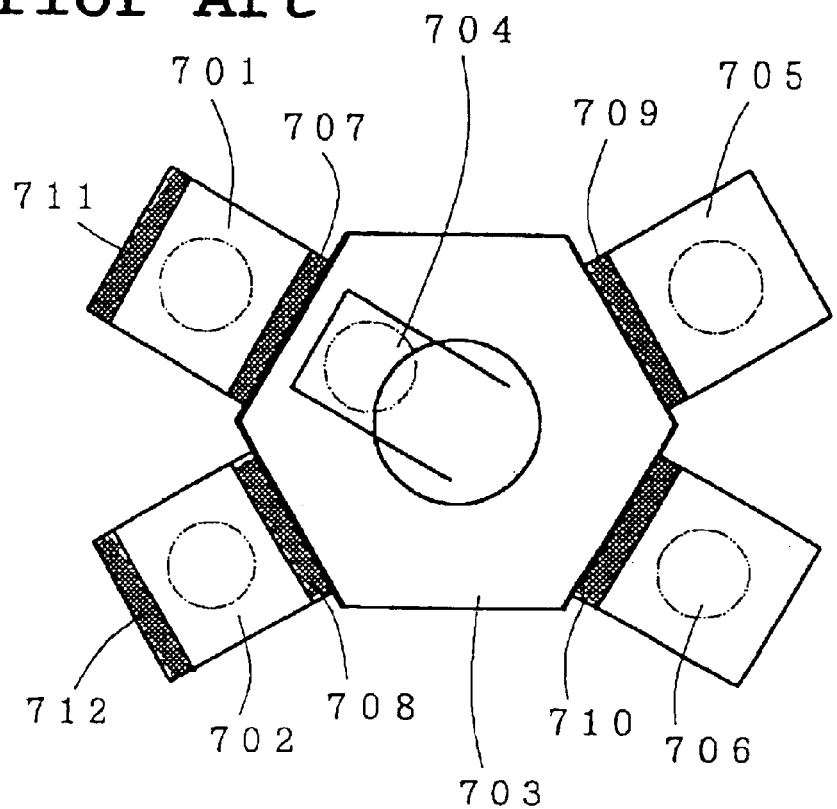
FIG. 9 is a diagram for explaining a construction of a conventional vacuum apparatus.
Figure 10:
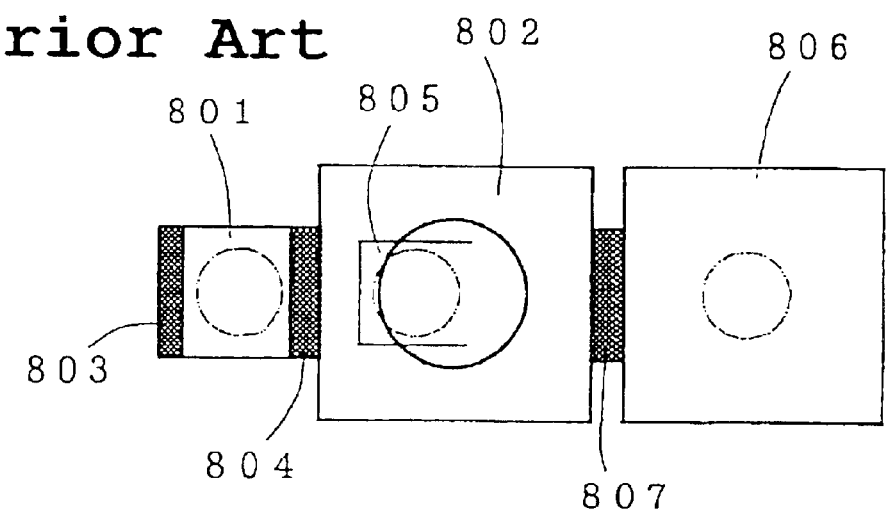
FIG. 10 is A diagram for explaining a construction of the conventional vacuum apparatus.

FIG. 8 is a cross-sectional side view showing a second embodiment of the present invention. As for the First embodiment, the holder hand transfer bodies are constructed in two stages of an upper stage and a lower stage in the second embodiment.

The second embodiment differs from the first embodiment in the following points: the holder hand transfer body 6 (or 7) has a linear guide portion 26 of two stages, and this linear guide portion 26 attaches the work-piece holder hand 11 to its tip end and supports the object, to thereby make the work-piece holder hand 11 move feed and astern while the tape 10 extends and shrinks the linear guide portion 26 of two stages; a width direction of the tape 10 is made to match a horizontal direction, and a direction changing means 25 rotates the rear end side of the tape 10 by 90° downward to thereby perpendicularly lead the tape 10 to an empty space under a support base of the vacuum apparatus; and a magnet which moves linearly is used as a driving means.

The direction changing means 25 is composed of pulleys 25a, 25b, 25c and 25d disposed in the same arrangement as the feeding means 12 in the first embodiment. However, these pulleys 25a–25d are provided not for driving the tape 10 but for securely changing the direction of the tape 10 by 90°. The tape 10 is set so as to be slightly sandwiched between these pulleys.

Reference numeral 26 indicates a linear guide portion. This linear guide portion 26 is, in this embodiment, constructed to be a two-stage extendable type, which is composed of a base portion linear guide 27, a middle portion linear guide 28 and a tip member 29.

The base portion linear guide 27 is attached to a transfer apparatus bottom surface (base) 18. The middle portion linear guide 28 slides by means of a track base 28a disposed on a linear guide rail 27a on this base portion linear guide 27, and the tip member 29 slides by means of a track base 29a disposed on a linear guide rail 28b on the middle portion linear guide 28. Note that, the number of expansion and shrinkage stages of the linear guide portion 26 can be appropriately selected according to a ratio of a transfer distance to size of the transfer apparatus.

The tip end portion of the tape 10, which is disposed such that its width direction becomes horizontal and a convex portion of the curved cross section becomes the upper side, is attached to the tip member 29 and also indirectly to the work-piece holder hand 11 in this embodiment. That is, the work-piece holder hand 11 is attached to both the tape 10 and the tip member 29 of the linear guide portion 26.

Reference numeral 30 indicates a tape accommodating cylinder. This tape accommodating cylinder 30 accommodates the rear end portion of the tape 10 when the tape 10 is reversed, and is extendedly provided from the rear portion of the transfer apparatus 4 in an empty space under the support base of the vacuum apparatus to the downward. The inside of the tape accommodating cylinder 30 is connected to the transfer chamber 2 and becomes in the same atmospheric pressure as that in the transfer chamber 2.

In this tape accommodating cylinder 30, the rear end side of the tape 10 rotated downward by 90° by the direction changing means 25 is perpendicularly accommodated.

Reference numeral 31 indicates feeding means of the tape 10. This feeding means 31 is composed of a guide rail 32 perpendicularly provided along the outside of the tape accommodating cylinder 30, a track base 33 which is movable in a perpendicular direction through a guide by this guide rail 32, a driving magnet 34 fixed to this track base 33, a slider 35 fixed to the rear end portion of the tape 10 and capable of sliding in the internal cylinder of the tape accommodating cylinder 30, a driven magnet 36 fixed to this slider 35 and, although not shown, a vertical drive mechanism for driving the track base 33 in upward and downward directions. As this vertical drive mechanism, a mechanism of a motor and a feeding screw, an air cylinder, a motor and a belt or the like is used.

The driven magnet 36 and the driving magnet 34 are sucked to each other, and when the driving magnet 34 moves upward and downward, the driven magnet 36 also moves upward and downward following this.

Note that, the width direction of the tape 10 on the work-piece holder hand 11 side becomes horizontal and is liable to bend slightly by the self-weight, and if a stroke becomes long upon feeding, a danger of buckling increases. Therefore, a support roller 37 is provided in the middle portion linear guide 28 of the linear guide portion 26 for supporting the tape 10 from the upward and downward directions. Note that, if rigidity of the tape 10 is strong, the support roller 37 can be omitted.

In FIG. 8, a state, in which the linear guide portion 26 extends such that the tape 10 is in an extended state and the work-piece holder hand 11 is on the susceptor 8, is shown by a solid line. Both the magnets 34, 36 are located at the uppermost side of the tape accommodating cylinder 30 in this state.

When returning the work-piece holder hand 11, the driving magnet 34 moves downward to pull down the driven magnet 36, and as shown in a double-dotted chain line in the figure, the rear end portion of the tape 10 is pulled into the tape accommodating cylinder 30 to make the tape 10 be in a shrunk state.

In order to make the tape 10 be in an extended state and move the work-piece holder hand 11 to a position shown by the solid line in the figure, the driving magnet 34 moves upward to pull up the driven magnet 36. Since the tape 10 is made of an elastic material having a curved cross section, in a portion inside the straightly extended tape accommodating cylinder 30 and a portion further than the direction changing means 25, rigidity is high and bending can be prevented, and the tip member 29 of the linear guide portion 26 is pushed out to make the linear guide portion 26 be in an extended state.

In this magnet drive, in the same way as the pulley drive, the tape can be driven at a speed corresponding to an environment of use, whereby the work-piece can be smoothly and safely transferred without generating dust.

In the second embodiment, as an accommodating place of a tape in a shrunk state, the tape accommodating cylinder is formed by projecting the transfer apparatus to an empty space, whereby the transfer apparatus does not overhang in a lateral direction in the shrunk state. Further, the linear guide portion can also be shrunk compact. Therefore, as in the first embodiment, the transfer chamber can be made compactly, the size of which is not much different from that of the work-piece.

The driving means by means of the magnets used in the second embodiment is not directly driven by a motor in the outside of the vacuum apparatus as that in the first embodiment, and thus there is no need for a seal for keeping airtightness to thereby further enhance reliability of the vacuum chamber. It is also possible to use the driving means by means of the same pulley as that in the first embodiment by using the tape accommodating cylinder accommodation type of the second embodiment, thereby eliminating driving means by means of magnets and direction changing means, or to use the driving means by means of pulley as auxiliary drive of the drive by means of magnets.

A vacuum apparatus according to the present invention is provided with a work-piece holder hand in a tip end portion of a tape in a transfer apparatus, and a tape is extended in its longitudinal direction to extend the work-piece holder hand to the inside of a process chamber to transfer the same, and when finishing the transfer, the tape is returned to the inside of a transfer chamber, and the returned tape is wound around a reel or pulled inside a tape accommodating cylinder extendedly provided under the floor of the transfer chamber. Therefore, the returned tape does not overhand in left and right directions, whereby the transfer chamber can be made extremely compact, which is not much larger than the work-piece. Since the volume of the transfer chamber can be small and it becomes easy to place the chamber be in a vacuum, the transfer chamber can serve as the conventional load/unload chamber or both as a load chamber and an unload chamber.

Accordingly, the number of chambers is small and the whole vacuum apparatus becomes compact, whereby it becomes possible to manufacture the apparatus at low cost with a small setting area. This kind of vacuum apparatus is set inside an expensive clean room, and if the setting area of the vacuum apparatus is small, it becomes possible to use a small-scale clean room, which is inexpensive. Thus, an extremely high economic effect can be attained.

A transfer apparatus according to the present invention is provided with a work-piece holder hand in a tip end portion of a tape, the tape slides in its longitudinal direction to overhand and the work-piece holder hand can be transferred for a great distance. Besides, when returning the tape, the returned tape is wound around a reel or pulled inside a tape accommodating cylinder extendedly provided under the apparatus or the like, whereby the returned tape does not overhang in left and right directions as the conventional turning arm type or the frog-leg type. Thus, it is suitable to dispose the apparatus in a narrow room or a place around which is crowded.

When a tape made of an elastic material having a curved cross section is used as the tape, the tape itself becomes high in rigidity, whereby it becomes possible to support and transfer the work-piece without using other support means.

When the tape is made to feed in a transfer direction by means of a driving pulley, it becomes easy to control the feeding speed, whereby it becomes possible to transfer the work-piece at a speed which is appropriate for an operation environment such as a vacuum environment.

When the rear end side of the tape is wound by means of winding means or the rear end side of the tape is accommodated inside a tape accommodating cylinder extendedly provided in upward and downward directions, the returned tape does not overhang in its circumference and extra space is not required.

When the tape accommodating cylinder is used, the rear end side of the tape is driven by magnets and the tape can be fed from the outside, whereby it becomes easy to keep airtightness when used in a vacuum environment.

When the work-piece holder hand is further attached to a tip member of a linear guide portion, which is attached to a base, the linear guide portion having rigidity supports the supporting of the holder hand, whereby it becomes possible to overhang the tape longer or to transfer a heavier work-piece.

When a pair of tapes is symmetrically provided and both the tip end portions of this pair of tapes support the work-piece holder hand, it becomes possible to stably support the work-piece holder hand.

Furthermore, also, when a plurality of pairs of tapes and feeding means thereof are provided on an upper side and a lower side, it becomes possible to efficiently perform operation of transfer to and transfer from of the work-piece.

What is claimed is:

1. A vacuum apparatus comprising:

a process chamber for processing a workpiece;

a transfer chamber connected to the process chamber via a gate valve;

a transfer apparatus disposed in the transfer chamber, the transfer apparatus having a pair of generally parallel and spaced-apart tapes each having a tip end portion and at least one workpiece holder connected to the tip end portion of each of the tapes for supporting the workpiece, the tapes being configured to undergo movement from a retracted position to an extended position in which the tapes are extended in a longitudinal direction thereof via the gate valve to position the workpiece holder and the workpiece in the process chamber; and feeding means for feeding the tapes in the longitudinal direction to the extended position.

2. A vacuum apparatus according to claim 1; wherein each of the tapes is made of an elastic material having a curved cross-section.

3. A vacuum apparatus according to claim 1; wherein the feeding means comprises a driving pulley.

4. A vacuum apparatus according to claim 1; further comprising a linear guide member connected to the front end portion of the tapes for movement therewith; and wherein the workpiece holder is connected to an end portion of the linear guide member.

5. A vacuum apparatus according to claim 1; wherein the at least one workpiece holder comprises a plurality of workpiece holders each disposed on a respective one of an upper side and a lower side of the tapes.

6. A vacuum apparatus according to claim 1; wherein the tapes are symmetrical about a longitudinal central axis of the workpiece holder.

7. A vacuum apparatus comprising:

a process chamber for processing a workpiece;

a transfer chamber connected to the process chamber via a gate valve;

a transfer apparatus disposed in the transfer chamber, the transfer apparatus having a tape having a front end portion and a workpiece holder connected to the front end portion of the tape for supporting the workpiece, the tape being configured to undergo movement from a retracted position to an extended position in which the tape is extended in a longitudinal direction thereof via the gate valve to position the workpiece holder and the workpiece in the process chamber;

a generally cylindrical-shaped case connected to the transfer chamber for accommodating a rear end portion of the tape; and a feeding mechanism for feeding the tape in the longitudinal direction to the extended position, the feeding mechanism having a driven magnet connected to the rear end portion of the tape and a driving magnet mounted on an exterior surface of the cylindrical-shaped case to undergo movement for driving the driven magnet to feed the tape in the longitudinal direction.

8. A vacuum apparatus comprising:

a process chamber for processing a workpiece;

a transfer chamber connected to the process chamber via a gate valve;

a transfer apparatus disposed in the transfer chamber, the transfer apparatus having a tape and a workpiece holder connected to the tape for supporting the workpiece, the tape being configured to undergo movement from a retracted position in which the tape is disposed in the transfer chamber to an extended position in which the tape is extended in a longitudinal direction thereof via the gate valve to position the workpiece holder and the workpiece in the process chamber;

feeding means for feeding the tape in the longitudinal direction to the extended position; and a linear guide member supporting the workpiece holder and connected to the tape for movement therewith, the linear guide member having a plurality of linear guide portions connected to undergo sliding movement relative to one another during movement of the tape in the longitudinal direction.

9. A transfer apparatus comprising:

at least one workpiece holder for supporting a workpiece;

a pair of generally parallel and spaced-apart tapes each having a tip end portion connected to the workpiece holder, the tapes being configured to undergo movement from a retracted position to an extended position in which the tapes are extended in a longitudinal direction thereof; and feeding means for feeding the tapes in the longitudinal direction to the extended position.

10. A transfer apparatus according to claim 9; wherein each of the tapes is made of an elastic material having a curved cross-section.

11. A transfer apparatus according to claim 9; wherein the feeding means comprises a driving pulley.

12. A transfer apparatus according to claim 9; further comprising a linear guide member connected to the tip end portion of the tapes for movement therewith; and wherein the workpiece holder is connected to an end portion of the linear guide member.

13. A transfer apparatus according to claim 9; wherein the at least one workpiece holder comprises a plurality of workpiece holders each disposed on a respective one of an upper side and a lower side of the tapes.

14. A vacuum apparatus according to claim 9; wherein the tapes are symmetrical about a longitudinal central axis of the workpiece holder.

15. A transfer apparatus comprising:

a workpiece holder for supporting a workpiece;

a tape having a tip end portion connected to the workpiece holder, the tape being configured to undergo movement from a retracted position to an extended position in which the tape is extended in a longitudinal direction thereof;

feeding means for feeding the tape in the longitudinal direction to the extended position; and a generally cylindrical-shaped case for accommodating a rear end portion of the tape;

wherein the feeding means comprises a driven magnet connected to the rear end portion of the tape and a driving magnet mounted on an exterior surface of the cylindrical-shaped case to undergo movement for driving the driven magnet to feed the tape in the longitudinal direction.

16. A transfer apparatus comprising:

a workpiece holder for supporting a workpiece;

a tape having a tip end portion connected to the workpiece holder, the tape being configured to undergo movement from a retracted position to an extended position in which the tape is extended in a longitudinal direction thereof;

feeding means for feeding the tape in the longitudinal direction to the extended position; and a linear guide member supporting the workpiece holder and connected to the tape for movement therewith, the linear guide member having a plurality of linear guide portions connected to undergo sliding movement relative to one another during movement of the tape in the longitudinal direction.

17. A vacuum apparatus comprising:

a process chamber for processing a workpiece;

a transfer chamber connected to the process chamber via a gate valve;

a transfer apparatus having linear guide, at least one workpiece holder connected to a tip end portion of the linear guide for supporting the workpiece, and a tape having an end portion connected to the tip end portion of the linear guide, the tape being configured to undergo movement from a retracted position to an extended position in which the tape is extended in a longitudinal direction thereof via the gate valve to move the linear guide to position the workpiece holder and the workpiece in the process chamber;

a generally cylindrical-shaped case connected to the transfer chamber for accommodating a rear end portion of the tape; and a feeding mechanism for feeding the tape in the longitudinal direction to the extended position, the feeding mechanism having a driven magnet connected to the rear end portion of the tape and a driving magnet mounted on an exterior surface of the cylindrical-shaped case to undergo movement for driving the driven magnet to feed the tape in the longitudinal direction.

18. A vacuum apparatus according to claim 17; wherein the at least one workpiece holder comprises a plurality of workpiece holders each disposed on a respective one of an upper side and a lower side of the tape.

19. A vacuum apparatus comprising:

a process chamber for processing a workpiece;

a transfer apparatus for positioning the workpiece in the process chamber and for removing the workpiece from the process chamber, the transfer apparatus having a pair of generally parallel and spaced-apart transfer bodies and a workpiece holder connected to the transfer bodies for supporting the workpiece, the transfer bodies being configured to undergo movement from a retracted position to an extended position in which the transfer bodies are extended in the longitudinal direction to position the workpiece holder and the workpiece in the process chamber;

a feeding mechanism for feeding the transfer bodies in a longitudinal direction thereof to position the workpiece holder and the workpiece in the process chamber; and a winding mechanism for winding the transfer bodies to the retracted position.

20. A vacuum apparatus comprising:

a process chamber for processing a workpiece;

a transfer apparatus for positioning the workpiece in the process chamber and for removing the workpiece from the process chamber, the transfer apparatus having a pair of generally parallel and spaced-apart transfer bodies and a workpiece holder connected to the transfer bodies for supporting the workpiece, each of the transfer bodies being made of an elastic material having a curved cross-section; and a feeding mechanism for feeding the transfer bodies in a longitudinal direction thereof to position the workpiece holder and the workpiece in the process chamber.

21. A vacuum apparatus comprising:

a process chamber for processing a workpiece;

a transfer apparatus for positioning the workpiece in the process chamber and for removing the workpiece from the process chamber, the transfer apparatus having a pair of generally parallel and spaced-apart transfer bodies and a workpiece holder connected to the transfer bodies for supporting the workpiece;

a feeding mechanism for feeding the transfer bodies in a longitudinal direction thereof to position the workpiece holder and the workpiece in the process chamber; and a slide mechanism connected to the transfer bodies and supporting the workpiece holder, the slide mechanism having a plurality of slide members mounted to undergo sliding movement during movement of the transfer bodies in the longitudinal direction to position the workpiece holder and the workpiece in the process chamber.

22. A vacuum apparatus comprising:

a process chamber for processing a workpiece;

a transfer apparatus for positioning the workpiece in the process chamber and for removing the workpiece from the process chamber, the transfer apparatus having a pair of generally parallel and spaced-apart transfer bodies and a workpiece holder connected to the transfer bodies for supporting the workpiece, the workpiece holder having a base portion, a plurality of support portions projecting from the base portion in a first direction, and a plurality of connecting portions projecting from the base portion in a second direction opposite to the first direction and connected to the transfer bodies; and a feeding mechanism for feeding the transfer bodies in a longitudinal direction thereof to position the workpiece holder and the workpiece in the process chamber.

23. A vacuum apparatus comprising:

a process chamber for processing a workpiece;

a transfer apparatus for positioning the workpiece in the process chamber and for removing the workpiece from the process chamber, the transfer apparatus having a pair of generally parallel and spaced-apart transfer bodies and a workpiece holder connected to the transfer bodies for supporting the workpiece; and a feeding mechanism comprised of a plurality of pulleys for feeding the transfer bodies in a longitudinal direction thereof to position the workpiece holder and the workpiece in the process chamber.

* * * * *